US007358830B2

(12) United States Patent
Hacker

(10) Patent No.: US 7,358,830 B2
(45) Date of Patent: Apr. 15, 2008

(54) COMPACT SEGMENTED STUB

(75) Inventor: Jonathan Bruce Hacker, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 174 days.

(21) Appl. No.: 11/152,485

(22) Filed: Jun. 14, 2005

(65) Prior Publication Data

US 2006/0279383 A1 Dec. 14, 2006

(51) Int. Cl.
*H03H 7/38* (2006.01)

(52) U.S. Cl. ........................................ 333/34; 333/263

(58) Field of Classification Search .................. 333/33, 333/34, 35, 263, 156, 161
See application file for complete search history.

(56) References Cited

U.S. PATENT DOCUMENTS

| | | | | |
|---|---|---|---|---|
| 4,034,321 | A * | 7/1977 | Ward et al. | 333/238 |
| 5,521,431 | A * | 5/1996 | Tahara | 257/676 |
| 2003/0174092 | A1* | 9/2003 | Sullivan et al. | 343/702 |

* cited by examiner

*Primary Examiner*—Stephen E. Jones
(74) *Attorney, Agent, or Firm*—Eugene S. Indyk

(57) ABSTRACT

A segmented stub has at least one serpentine signal path that increases the effective electrical length of the stub without increasing the overall physical length or area of the stub. This permits more compact monolithic millimeter-wave and microwave integrated circuit design.

5 Claims, 5 Drawing Sheets

COMPACT SEGMENTED STUB

TECHNICAL FIELD

This disclosure relates to high frequency circuitry, such as microwave circuitry, millimeter-wave circuitry, and the like. Specifically, this disclosure relates to improved circuit elements that provide frequency dependent reduced impedances such as short circuits.

BACKGROUND

In designing monolithic microwave integrated circuits (MMIC's), a radial stub is often used to provide a frequency selective short circuit. The standard radial stub is a pie shaped metal structure whose radial length is nominally a quarter-wavelength of the desired operational frequency. Such stubs tend to be quite large and consume significant epitaxial substrate real estate leading to large and expensive circuits. There thus is a need to reduce the amount to real estate consumed by the components of an MMIC so that cheaper and smaller MMIC designs can be obtained.

SUMMARY

This need is met by the provision of a meandering serpentine path that provides an increased electrical length device within the footprint of a conventional stub. In one example of the invention, one or more cutouts are provided in the edges of a stub to create a serpentine conductive layer on a substrate. In another example of the invention, one or more cut outs are provided in the edges of a radial stub. The one or more cut outs increase the electrical length of the stub without increasing the radial length or surface area of the stub. This allows a smaller stub for a given frequency of operation leading to smaller and more compact and economical MMIC designs. As discussed below, there are other examples of the invention that provide this characteristic. Additional examples will readily occur to those skilled in the art.

DETAILED DESCRIPTION

Figure 1:
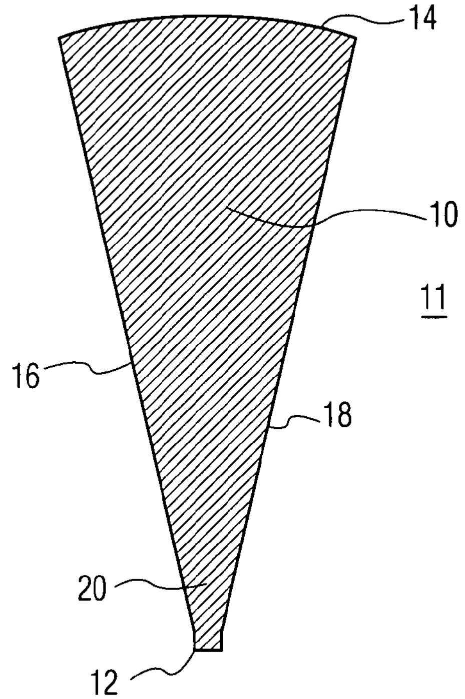
FIG. 1 PRIOR ART
FIG. 1 shows a conventional radial stub.

FIG. 1 shows a conventional radial stub used to provide a frequency dependent short circuit in microwave circuitry.

The nominal short circuit frequency is centered within a relatively narrow band of frequencies determined by the size and shape of the stub, most notably by its radial length in this instance. The radial stub 10 is a layer of conductive material, such as gold, silver, or copper, deposited on one major surface of a non-conductive dielectric substrate having a conductive ground plane on the other major surface of the substrate. The substrate has a predetermined thickness to provide a desired separation between the radial stub and the ground plane. The thickness of the stub 10 preferably is at least the skin depth or more.

The layer of conductive material is pie-shaped and comprises a narrow end 12 and a wider end 14. The stub 10 includes two radially directed edges 16 and 18 between ends 12 and 14. The edges 16 and 18 each form an angle of approximately 5° to approximately 85° with respect to the center line 20 of the stub 10. The radial length of the stub 10 is nominally a quarter wavelength of the nominal operational frequency at which a short circuit is desired.

This type of structure in FIG. 1 can consume too much surface area on an MMIC.

Figure 2:
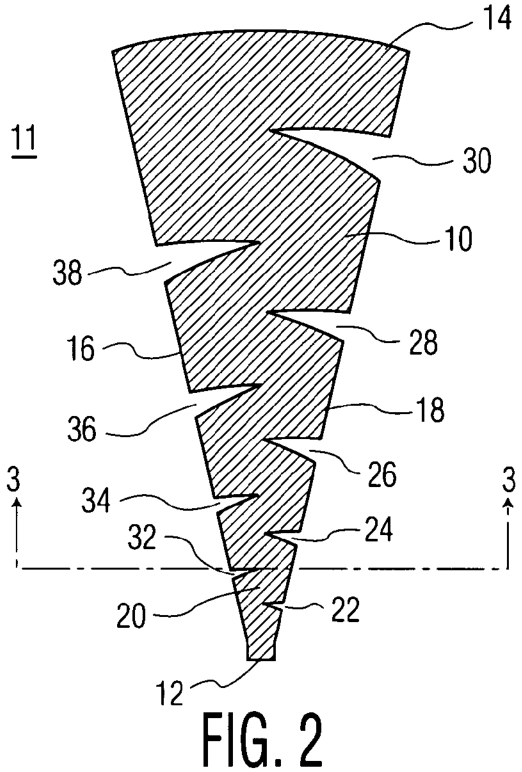
FIG. 2 shows an example of a segmented radial stub in accordance with the invention.
Figure 3:
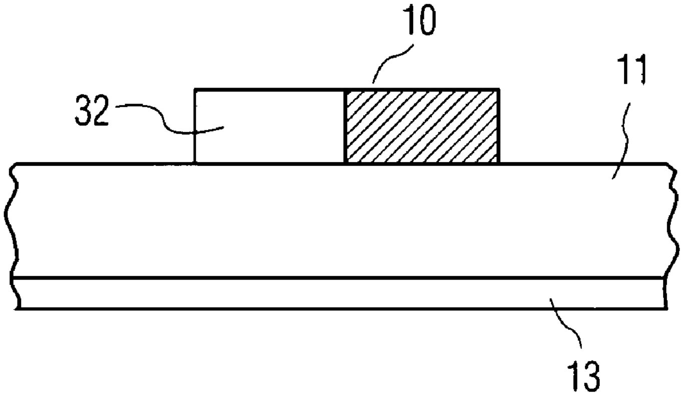
FIG. 3 is a cross sectional view of the device shown in FIG. 2 taken along section line 3-3 in FIG. 2.

FIGS. 2 and 3 show an example of a radial stub in accordance with the invention. It is a structure that provides a reduced impedance, such as a short circuit, at a certain nominal operational frequency, but for a given operational frequency, it is radially shorter than the configuration of FIG. 1 and takes up less space in an MMIC application. Like the stub of FIG. 1, the stub 10 is a generally pie shaped conductive layer formed on one major surface of a non-conductive substrate 11 having a conductive ground plane 13 on its other major surface. The stub of FIG. 2 has ends 12 and 14 and radially extending edges 16 and 18 each forming an angle of approximately 5° to approximately 85° with respect to the center line 20 of the device. As in the structure of FIG. 1, the thickness of the stub 10 in FIGS. 2 and 3 is at least the skin depth or more.

A series of notches or cutouts 22, 24, 26, 28, and 30 are formed in the edge 18 at predetermined locations along that edge 18. Another series of notches or cut outs 32, 34, 36, and 38 are formed in the edge 16. The cut outs 32, 34, 36, and 38 are spaced along the edge 16 so that they are radially staggered with respect to the cut outs 22, 24, 26, and 30 in edge 18, thus creating a meandering serpentine structure within the general footprint of a conventional radial stub like the one in FIG. 1. The effective electrical length of the device thus is increased for a given overall radial length. This reduces the size of such components used in MMIC applications which reduces fabrication costs and provides a competitive advantage.

The dimensions of the cut outs increase with increasing radial distance from the narrow end 12 of the stub in FIG. 2. The spacing between adjacent cut outs also increases with increasing radial distance from the narrow end 12 of the stub. The cross sectional area of the stub normal to current flow likewise increases with increasing radial distance from the narrow end 12 of the stub.

Stubs in accordance with the invention can be dimensioned for use in circuitry operating, for example, above about 10 GHz. Such stubs can also be dimensioned for use in circuitry operating below 10 GHz. The overall radial dimensions of such stubs can be as much as about 50% less than the overall radial dimensions of conventional radial stubs operating at comparable frequencies.

The cut outs shown in FIG. 2 have curved edges each extending to a respective point on the center line 20 of the stub 10. The shape, depth, and spacing of the cut outs in FIG. 2 are illustrative, however. Any shape, depth, and spacing of the cut outs that produce a desired stub size and frequency of reduced impedance may be used. The nature of the cut outs to achieve a desired result can be determined by experimentation.

Although the footprint of the stub of FIG. 2 is a sector of a circle, other flared shapes are possible for the footprint, such as triangles and structures with curved sides, such as horn shapes, as long as cut outs can be formed in edges of the device so that a meandering serpentine arrangement of increased electrical length and reduced operational short circuit frequency is achieved. Other shapes are also possible as long as cutouts along one or more edges can be appropriately included so as to result in a serpentine structure that increases the electrical length of the device without increasing the size of its footprint.

Figure 4:
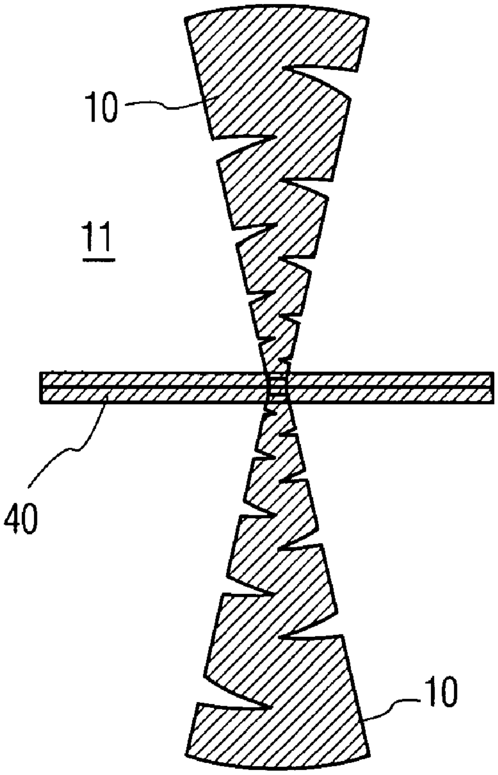
FIGS. 4 and 5 are additional embodiments of the invention involving multiple stub structures, like the one in FIG. 2, connected to a common input terminal.
Figure 5:
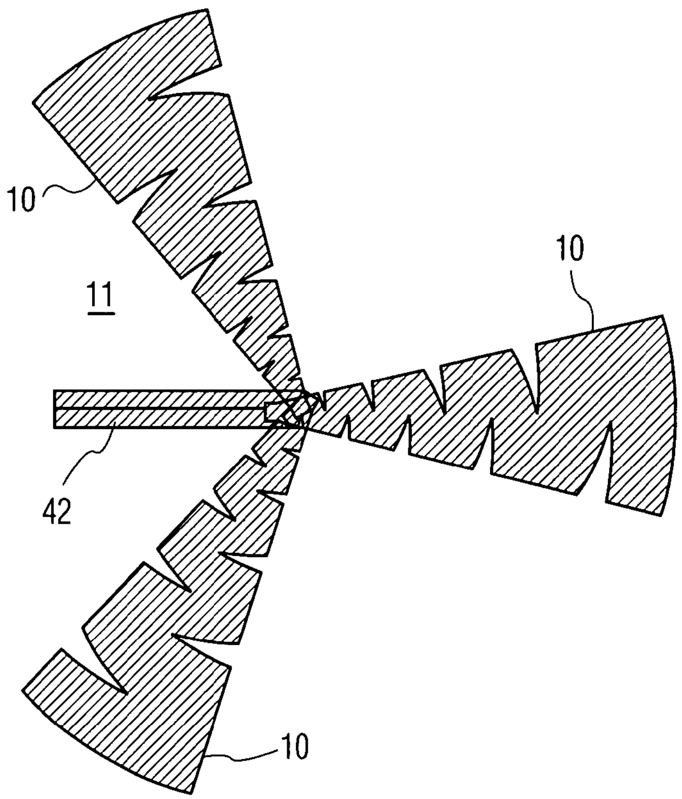

FIG. 4 shows a stub structure involving two stubs 10 formed on the substrate 11 like the one shown in FIG. 2. The narrow end 12 of each stub 10 is joined to a common input terminal 40 on the substrate. The centerlines 20 of the stubs 10 form a 180° angle. Any number of stubs 10 can be connected together to a common input terminal 40. FIG. 5 shows an example of three stubs 10 connected to a common input terminal 42.

Figure 6:
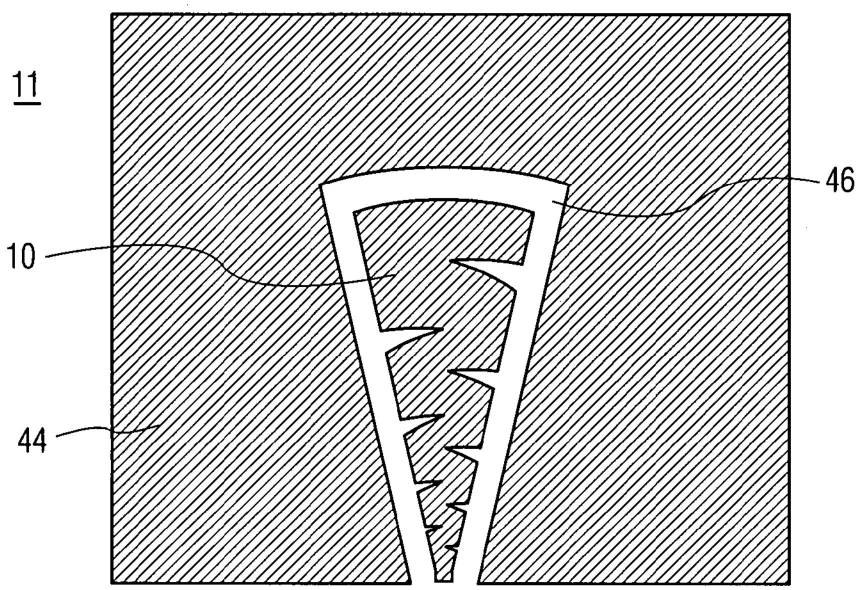
FIG. 6 is another embodiment of the invention involving a ground plane on the same side of a substrate supporting a stub structure like the one in FIG. 2.

FIG. 6 shows a variation of the embodiment of FIG. 2 in which a radial stub 10 is coplanar with a ground plane 44 on one major surface of a non-conductive substrate 11. The stub 10 is located in a sector shaped opening 46 and is spaced a predetermined distance from the edges of the ground plane 44 around the periphery of the stub 10. In addition to the ground plane 44 on the same side of the substrate as the stub 10, another ground plane like ground plane 13 in FIG. 3 may be located on the back side of the substrate 11.

Figure 7:
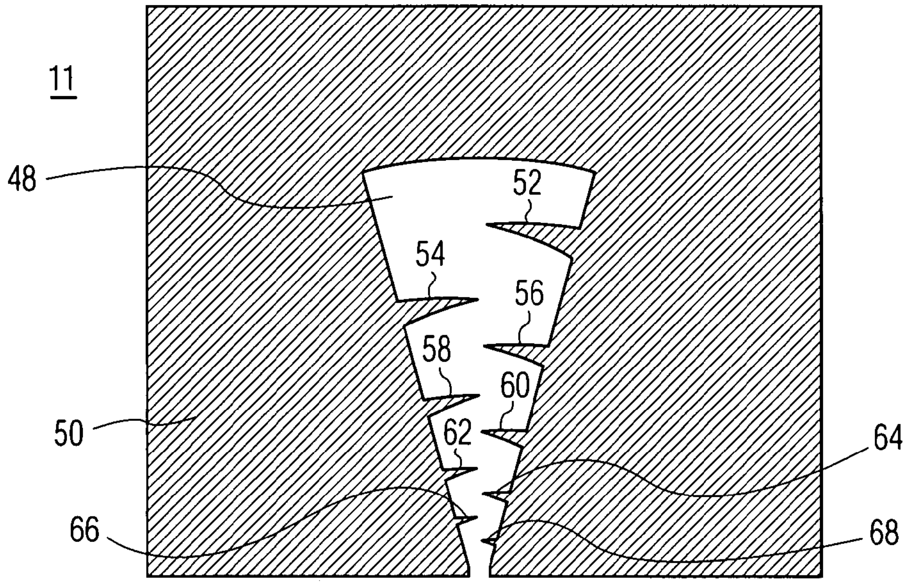
FIG. 7 is yet an additional embodiment of the invention involving a stub structure defined by the absence of metal in a layer of conductive material.

Stubs in accordance with this invention can be defined by the absence of conductive material in a predetermined region of conductive layer or ground plane. FIG. 7 shows such a variation of the invention whereby the stub is defined by a shaped opening 48 in a conductive layer 50 situated on a non-conductive substrate 11. The opening 48 may have the same general shape as a stub composed of a shaped conductive layer. The example shown in FIG. 7 is shaped like the radial stub of FIG. 2. Other shapes for opening 48 also are possible, such as those shown in FIGS. 4-6, and 8. The meandering serpentine shape of the stub in FIG. 7 is created by the provision of protrusions 52, 54, 56, 58, 60, 62, 64, 66, and 68 extending into opening 48, instead of cut outs.

Figure 8:
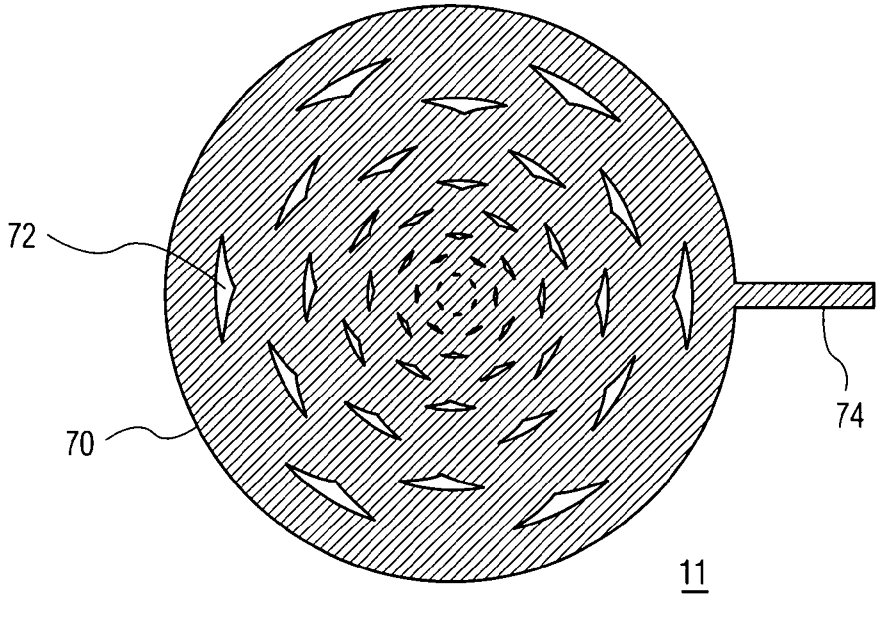
FIG. 8 shows an embodiment of the invention involving a circular shaped stub.
Figure 9:
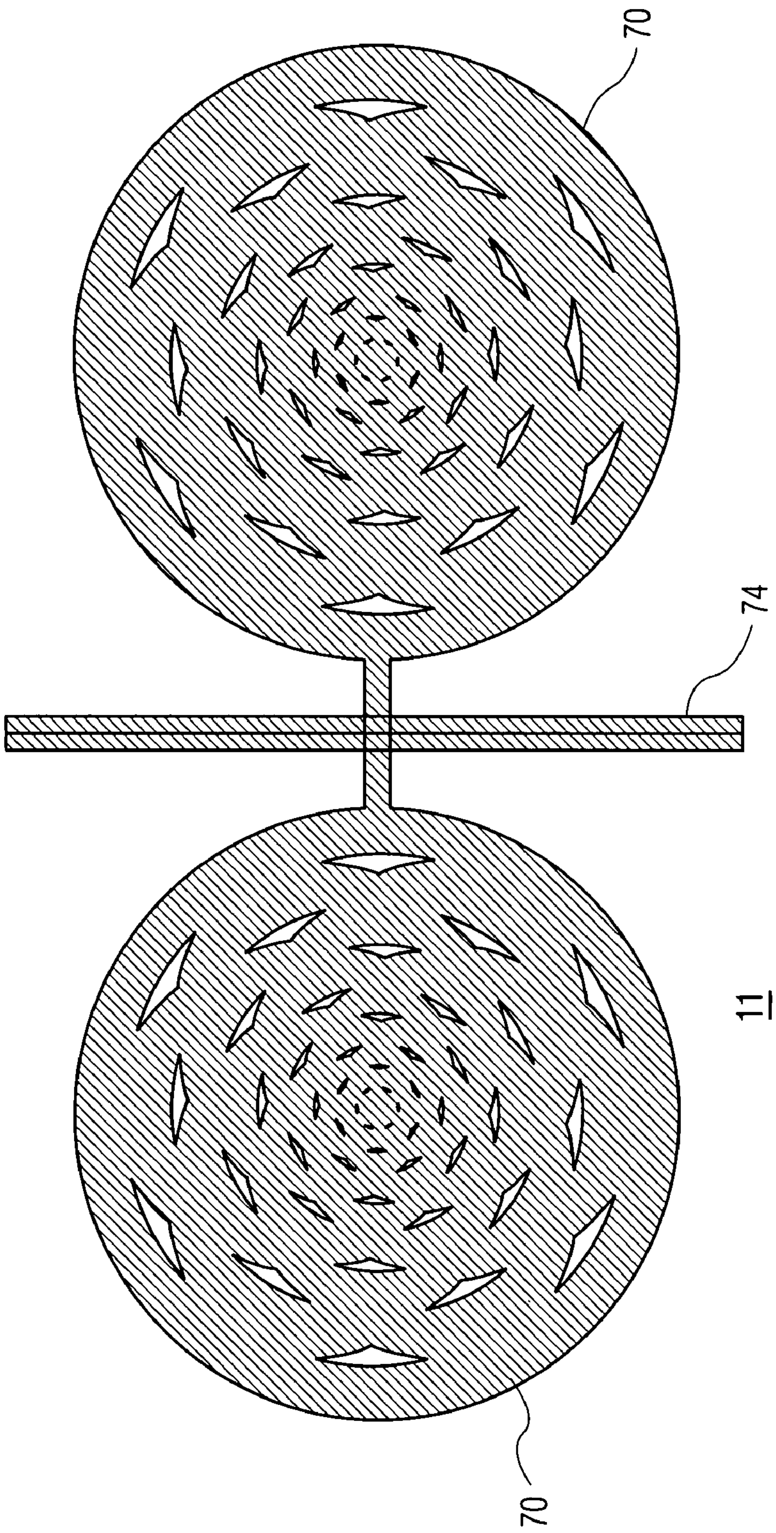
FIG. 9 shows an embodiment of the invention involving multiple circular stub structures joined at a common input terminal.

FIG. 8 shows a circular ball stub 70 in accordance with the invention comprising a circular patch of conductive material on a non-conductive substrate. The ball stub 70 has a plurality of concentric rings of cut outs 72 formed in the circular structure. Radially adjacent rings of cut outs 72 are circumferentially staggered to provide meandering serpentine electrical paths from the center of the ball stub 70 to the periphery of the ball stub 70. The dimensions of the cut outs 72 increase with increasing radial distance from the center of the ball stub 70. The distance between radially adjacent rings of cut outs 72 also increases as radial distance from the center of the ball stub increases. The ball stub 70 of FIG. 8 is connected to a common input terminal 74 on the substrate. Although the ball stub 70 in FIG. 8 is shown to be a unitary structure, it may be plurality of FIG. 2 radial stubs laid radial edge to radial edge around the entire circumference of the circular structure. Any number of ball stubs 70 may be connected to a common input terminal 74. As shown in FIG. 9, for example, two ball stubs 70 may be connected to a common input terminal 74. As in the case of the radial stub shape of FIG. 2, stubs like the ones shown in FIGS. 4-7 are possible for the ball stub shape. For example, a ball stub embodiment like the radial stub embodiment of FIG. 7 can be implemented by a circular opening in a layer of conductive material with conductive islands corresponding to the cut outs 72 in the circular opening.

This invention can be used, for example, in any microwave or millimeter-wave MMIC design that requires the use of frequency dependent reduced impedance or short circuit elements. A specific example of circuitry in which stubs in accordance with the invention can be advantageously used is the dc decoupling circuitry in a multi-stage W-band antimonide based compound semiconductor low-noise amplifier.

Stubs in accordance with this invention can be fabricated using any technique that is able to create a conductive layer or film on a substrate having the desired shape and dimensions. For example, patterned metallization can be created by lithographic techniques used in the semiconductor industry.

The Title, Technical Field, Background, Summary, Brief Description of the Drawings, Detailed Description, and Abstract are meant to illustrate the preferred embodiments of the invention and are not in any way intended to limit the scope of the invention. The scope of the invention is solely defined and limited in the claims set forth below.

The invention claimed is:

1. A stub comprising:

a layer of conductive material formed on a substrate, the layer of conductive material comprising:

first and second diverging edges; and one or more elements formed in one or both of the diverging edges that create a serpentine path through the stub.

2. The stub of claim 1, in which the first and second diverging edges are radially directed from a first end of the stub to a second end of the stub.

3. The stub of claim 1, in which the one or more elements are one or more cut outs in one or both of the diverging edges.

4. The stub of claim 1, in which the one or more elements are one or more protrusions from one or both of the diverging edges.

5. The stub of claim 1, in which the layer of conductive material provides a reduced impedance at a predetermined frequency.

* * * * *

UNITED STATES PATENT AND TRADEMARK OFFICE

CERTIFICATE OF CORRECTION

PATENT NO. : 7,358,830 B2
APPLICATION NO. : 11/152485
DATED : April 15, 2008
INVENTOR(S) : Jonathan Bruce Hacker It is certified that error appears in the above-identified patent and that said Letters Patent is hereby corrected as shown below:

In the specification

Column 1, line 4, before paragraph 1 insert the following:

--This invention was made with Government support under contract N66001-01-C-8032 awarded by the Department of Defense, DARPA, US Navy, Space & Naval Warfare Systems (SPAWAR). The Government has certain rights in the invention.--

Signed and Sealed this
Twelfth Day of July, 2016

Michelle K. Lee
*Director of the United States Patent and Trademark Office*